United States Patent [19]

Edmond et al.

[11] Patent Number: 5,008,735
[45] Date of Patent: Apr. 16, 1991

[54] PACKAGED DIODE FOR HIGH TEMPERATURE OPERATION

[75] Inventors: John A. Edmond, Apex; Douglas G. Waltz, Durham, both of N.C.; Muni M. Mitchell, Huntington, N.Y.; Mohammad Sedigh, New York; Roman Hamerski, Smithtown, both of N.Y.

[73] Assignees: General Instrument Corporation, N.Y.; Cree Research, Inc., N.C.

[21] Appl. No.: 447,213

[22] Filed: Dec. 7, 1989

[51] Int. Cl.$^5$ ............................................ H01L 23/02
[52] U.S. Cl. ...................................... 357/74; 357/72; 357/73; 357/76
[58] Field of Search .............................. 357/73, 74, 79

[56] References Cited

U.S. PATENT DOCUMENTS

| | | |
|---|---|---|
| 3,300,841 | 1/1967 | Fisher et al. |
| 3,447,236 | 6/1969 | Hatcher, Jr. |
| 3,611,064 | 10/1971 | Hall .................................. 317/234 R |
| 3,641,663 | 2/1972 | Osoegawa ............................ 19/589 |
| 3,650,826 | 3/1972 | Ganser ................................ 117/217 |
| 3,844,029 | 10/1974 | Dibugnara . |
| 3,930,306 | 1/1976 | Goldberg et al. ..................... 357/67 |
| 3,984,861 | 10/1976 | Kessler, Jr. ............................ 357/82 |
| 3,987,217 | 10/1976 | Greeson et al. . |
| 3,996,602 | 12/1976 | Goldberg ............................. 357/72 |
| 4,117,589 | 10/1978 | Francis ................................ 357/73 |
| 4,153,910 | 5/1979 | Itoh et al. . |
| 4,564,885 | 1/1986 | McCann . |
| 4,567,110 | 1/1986 | Jarvinen . |
| 4,702,967 | 10/1987 | Black et al. . |
| 4,745,089 | 5/1988 | Orban . |

Primary Examiner—Andrew J. James
Assistant Examiner—Reginald A. Ratliff
Attorney, Agent, or Firm—Bell, Seltzer, Park & Gibson

[57] ABSTRACT

The invention is a packaged diode suitable for operation at temperatures above 200° C. and during temperature excursions between −65° C. and at least 350° C. The invention comprises a diode having respective p-n portions with a p-n junction therebetween, and formed of a semiconductor material that is stable and will exhibit satisfactory diode characteristics at such temperatures. Ohmic contacts are made to the opposite sides of the junction diode and to the respective p and n portions of the diode. An electrode adjacent each of the ohmic contacts is formed of an electrically conductive material that has a coefficient of thermal expansion similar to the coefficient of thermal expansion of the semiconductor material for providing structural support to the junction diode and electrical contact therewith. A lead contacts each of the electrodes opposite each electrode's contact with the diode. Each lead is formed of an electrically conductive material and is joined to the respective electrode by an alloy that likewise remains physically and electrically stable at temperatures greater than 200° C. and during repetitive operating cycles over temperature excursions between about −65° C. and 350° C. A packaging material surrounds the junction diode and portions of the electrode to hermetically seal it.

29 Claims, 1 Drawing Sheet

U.S. Patent
Apr. 16, 1991
5,008,735
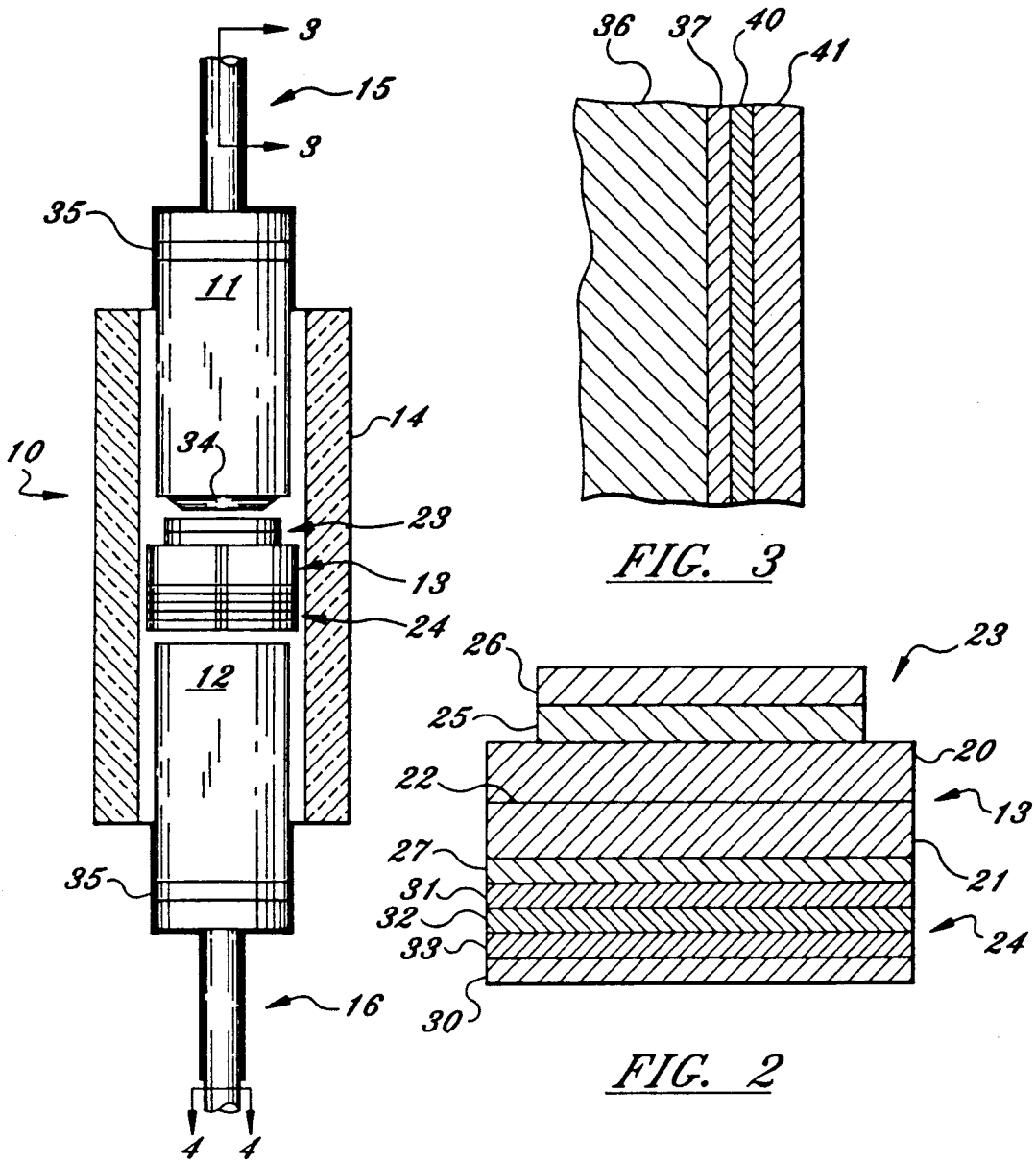
FIG. 3
FIG. 2
FIG. 1
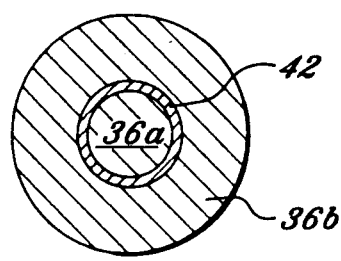
FIG. 4
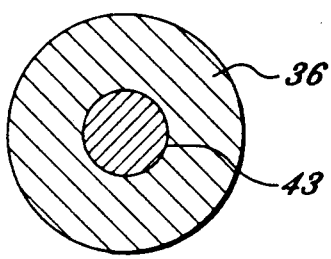
FIG. 5

PACKAGED DIODE FOR HIGH TEMPERATURE OPERATION

FIELD OF THE INVENTION

The present invention relates to packages and packaging techniques for diodes, and in particular relates to a packaging technique and resulting packaged rectifying diode formed in silicon carbide that is operable at temperatures of 350° C. or higher and over temperature excursions or cycles between −65° C. and 350° C.

BACKGROUND OF THE INVENTION

A diode is one of the most straightforward types of semiconductor devices and draws its name from its simple two-electrode structure. Diodes act as one way barriers to the passage of electrons because they permit electrons to flow in one direction, but bar their passage in the opposite direction under normal operating conditions. Typical applications for semiconductor diodes include rectification, the conversion of alternating current to pulses of direct current; clamping, the prevention of voltage in one wire from exceeding the voltage in a second wire; demodulation, the modification of a wave signal; and the production of logic gates, switching circuit building blocks which utilize "yes" and "no" statements as inputs to make certain simple decisions with the answer also expressed as "yes" or "no." Diodes are accordingly fundamental elements in modern electronic devices of all types.

Typically, the performance of diodes are characterized using five basic characteristics which are well understood in this art: forward current ($I_f$); forward voltage ($V_f$); reverse current ($I_r$); reverse breakdown voltage ($V_{br}$); and reverse recovery time ($T_{rr}$).

One candidate material for diodes with high quality characteristics is silicon carbide (SiC). Silicon carbide has a number of theoretical advantages for diodes and particularly for rectification. These include a wide band gap, a high thermal conductivity, a low dielectric constant, a high saturated electron drift velocity, a high breakdown electric field, a low minority carrier lifetime, and a high dissociation temperature. Taken together, these properties have long indicated that semiconductor devices formed from silicon carbide should be operable at much higher temperatures than devices made from other semi-conductor materials as well as at higher speeds and higher power levels.

For example, semiconductor devices used in applications as diverse as deep-well drilling and jet aircraft engines both require devices that can operate at temperatures of 200° C. and 350° C. respectively, or even higher. Additionally, however, devices in such applications must operate over wide temperature ranges as well, for example from below 0° C. to 350° C. To date, any devices available for such applications must be appropriately cooled--often a complicated engineering task--or are simply unavailable given the temperature limitations of common semiconductor materials such as silicon (Si).

Nevertheless, in spite of the long-standing recognition of the theoretical advantages offered by the electronic properties of silicon carbide, rectifying diodes and other semiconductor electronic devices formed from silicon carbide are just now beginning to reach the commercial marketplace. The lack of prior success in producing silicon carbide devices has resulted from the difficulties encountered in working with silicon carbide. Silicon carbide is an extremely hard material, often used as an abrasive. It must be worked at extremely high temperatures under which other materials cannot be worked, and crystallizes in well over 150 polytypes. Many of these polytypes are in turn separated by rather small thermodynamic differences. For these reasons, production of monocrystalline thin films of silicon carbide that are necessary for certain devices, and production of large single crystals of silicon carbide each having appropriate single polytypes, which are useful as substrate material and for other applications, have remained elusive goals. Additionally, certain doping techniques which have been successfully developed for other materials have proven unsuccessful when used in conjunction with silicon carbide.

Recently, however, and as set forth in co-pending applications Ser. No. 07/284,035, filed Dec. 14, 1988 and Ser. No. 07/403,690, filed Sept. 6, 1989 both to Edmond for "Ultra-Fast High Temperature Rectifying Diode Formed in Silicon Carbide," techniques have been developed for producing appropriate rectifying diodes in silicon carbide with particularly favorable characteristics. These applications are incorporated entirely herein by reference.

As set forth in these co-pending applications, the resulting silicon carbide devices can operate at extremely high temperatures; i.e. 350° C. or higher, temperatures at which devices formed from conventional semiconductor materials such as silicon, gallium arsenide, or indium phosphate, may become inoperable, melt, or even vaporize.

From a practical and commercial standpoint, the successful operation of such a silicon carbide device at such temperatures must be accompanied by an appropriate operational reliability. Such reliability depends upon a number of factors. These include: the mechanical stability of the semiconductor device and its housing, appropriate and reliable ohmic contacts to the device, reliable metallurgical bonds between contacts, the maintenance of the device and its features in original condition even under adverse operating conditions, the use of an air-tight envelope to prevent infliction of mechanical damage on the semiconductor material and to isolate it from harmful impurities in the surrounding environment or atmospheric air, and the use of appropriate passivating and protecting coatings. In particular, for a device formed from silicon carbide that is intended to operate at high temperature, the metallic contacts in the device must be carefully matched to avoid breakage during thermal cycling.

There thus exists the need for an appropriate packaging technology that will both enable and maintain the long term, reliable use of high temperature diodes both during high temperature operation and during excursions over wide temperature ranges.

One packaging technique common in the semiconductor industry is the so-called "double slug" diode. The double slug diode was developed to overcome the various shortcomings and power limitations of diodes that were constructed by soldering fine wire leads to the opposite faces of a small semiconductor "die" such as a junction diode. A double slug diode is typically formed of cylindrical portions of molybdenum (Mo) or tungsten (W) which in the prior art use with silicon have been coated with a protective layer of gold, silver or other noble metal. A semiconductor device such as a p-n junction diode is placed between the slugs. The slugs and the diodes sandwiched between them can then be packaged and sealed in plastic or glass. Wire leads are conveniently attached to the slugs (and exhibit greater structural stability) much more easily than fine wires can be attached directly to a diode. The wire leads in turn are used to add the resulting device to an intended circuit or other application.

To date, however, because most such diodes are formed of materials which operate at relatively low temperatures, and for which "high" temperatures are considered to be on the order of 150° C., the packaging materials and techniques used to form such devices are often disadvantageous and sometimes entirely useless in packaging a device formed from silicon carbide which must operate at much higher temperatures; e.g. 350° C. and above; and over correspondingly wide temperature ranges; e.g. −65° C. to about 350° C. or above.

One particularly important element is the method and material used to join the leads to the appropriate slugs. Some devices are held together simply by a glass or plastic packaging material. Others use joining materials such as solders or brazes to connect the leads to the slugs. Packaging the silicon carbide diodes of the present invention without any joining material is generally unsatisfactory because of the stresses that result from the wide temperature ranges over which the devices must operate. Conventional brazes or solders that are otherwise suitable for devices operating at ordinary temperatures can be unsatisfactory for operating conditions that include the temperatures at which the silicon carbide diodes of the present invention can operate. An appropriate joining material must have and maintain a high strength and a high power carrying capability at operating temperatures of 350° C. or greater and over time temperature cycles that include repetitive excursions between temperatures of −65° C. and 350° C. or more.

Typical solders have melting points well below 350° C. Common lead-tin (Sn-Pb) solders melt at about 179°–188° C. Gold-tin (Au-Sn) solders melt at about 280° C., and tend to form brittle joints. Brazes with higher melting points are available, e.g. gold-copper (Au-Cu, 780° C.), but also exhibit brittleness when operating temperatures of 350° C. are experienced. A lead-silver-tin solder is useful for some higher temperature operations, but has poor corrosion resistance. These and other properties of materials are discussed in D. Fink, "Electronics Engineers' Handbook" (Second Edition, 1982), Section 6.

There thus exists the need for a packaging technique and resulting package for a diode formed of silicon carbide for which all of the packaging elements are suitable for operation at temperatures above 200° C. and during temperature excursions at −65° C. and at least 350° C.

OBJECT AND SUMMARY OF THE INVENTION

It is accordingly an object of the present invention to produce a packaged diode suitable for operation at temperatures above 200° C. and during temperature excursions between −65° C. and at least 350° C. The present invention meets this object with a packaged diode that comprises a diode having respective p-n portions with a p-n junction therebetween, and formed of a semiconductor material that is stable and will exhibit satisfactory diode characteristics at such temperatures. Ohmic contacts are made to the opposite sides of the junction diode and to the respective p and n portions of the diode. An electrode adjacent each of the ohmic contacts is formed of an electrically conductive material that has a coefficient of thermal expansion similar to the coefficient of thermal expansion of the semiconductor material for providing structural support to the junction diode and electrical contact therewith. A conductive material between the ohmic contacts and the contact surfaces of each electrode provides physical and electrical contact therebetween, and is physically and electrically compatible with both the ohmic contacts and the electrode material, both at high temperatures and over wide temperature excursions. A lead contacts each of the electrodes opposite each electrode's contact with the diode. Each lead is formed of an electrically conductive material and is joined to the respective electrode by an alloy that likewise remains physically and electrically stable at temperatures greater than 200° C. and during repetitive operating cycles over temperature excursions between about −65° C. and 350° C. In particular, the melting temperature of the alloy is less than the melting temperature of the lead material. Finally, a package surrounds the junction diode and portions of the electrode to hermetically seal it.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DESCRIPTION OF THE DRAWINGS

FIG. 1 is a cross-sectional view of a packaged diode according to the present invention;

FIG. 2 is an enlarged cross-sectional view of the p-n junction diode apart from the package and the appropriate ohmic contacts thereto;

FIG. 3 is a partial cross-sectional view taken along lines 3—3 of FIG. 1;

FIG. 4 is a cross-sectional view taken along lines 4—4 of FIG. 1; and

FIG. 5 is a cross-sectional view of an alternate embodiment of the portion of the packaged diode that is illustrated in FIG. 4.

DETAILED DESCRIPTION OF THE PREFERRED EMBODIMENT

The present invention is a packaged diode suitable for operation at temperatures above 200° C. and during temperature excursions between −65° C. and at least 350° C. Although the packaged diode and its characteristics are discussed herein in terms of these temperatures, it will be understood by those familiar with the semiconductor device industry that these represent specifications desired by manufacturers or end users, and therefore are illustrative of the inventions's operating characteristics rather than limiting of them.

FIG. 1 is an illustration of the packaged diode which is broadly designated at 10. As illustrated in FIG. 1, the packaged diode 10 is of the type commonly referred to as a "double slug" diode which includes a coaxially aligned pair of electrode slugs 11 and 12 respectively. In the illustrated embodiment, slug 11 represents the anode and slug 12 represents the cathode. A p-n junction diode generally designated at 13 is disposed between the slugs 11 and 12 and is in electrical contact therewith. A package 14 encapsulates portions of the slugs 11 and 12 and the entire diode 13, and coaxially positioned "nailhead"

leads broadly designated at 15 and 16 respectively are positioned adjacent each of the slugs 11 and 12.

As illustrated in FIG. 2, the diode 13 has respective p and n portions 20 and 21 with a p-n junction 22 therebetween. The diode is formed of a semiconductor material that is stable and that will exhibit satisfactory diode characteristics at temperatures greater than 200° C. and over temperature excursions between −65° C. and 350° C. The preferred material for the diode is silicon carbide, and in which the p-n junction 22 is an abrupt p-n junction. It will be understood by those familiar with silicon carbide and semiconductor technology that the mere presence of bordering p and n-type regions is normally not enough to guarantee satisfactory diode characteristics. Therefore, in the most preferred embodiment, the diode 13 is formed of silicon carbide and the junction 22 is formed between a first portion of monocrystalline alpha silicon carbide having a first conductivity type and a flat interface surface that is inclined more than one degree off axis with respect to a basal plane thereof substantially towards one of the <11$\bar{2}$0> directions, and a second portion of monocrystalline silicon carbide that comprises an epitaxial layer of alpha silicon carbide having the opposite conductivity type homoepitaxially deposited on the flat interface surface of the first portion. for This technique of off-axis deposition of silicon carbide on silicon carbide is thoroughly described in U.S. Pat. No. 4,912,064 to Davis et al. for "Homoepitaxial Growth of Alpha-SiC Thin Films and Semiconductor Devices Fabricated Thereon,"

In FIG. 1 the diode has a generally round appearance, but it will be understood by those familiar with such devices that because of the way semiconductor dies are formed and cut, the diode's shape will often be either hexagonal or square.

As illustrated in FIGS. 1 and 2, ohmic contacts are made to opposite sides of the junction diode 13 for making electrical contact to the respective p and n portions of the junction diode 13. In FIGS. 1 and 2, these ohmic contacts are broadly designated as 23 and 24 and are preferably formed of an appropriate metal. As known to those familiar with semiconductor devices, an ohmic contact is a metal-semiconductor contact that has a negligible contact resistance relative to the bulk or spreading resistance of the semiconductor, and the selection of an appropriate ohmic contact can be made by those of skill in the semiconductor arts without undue experimentation. As further illustrated in FIG. 1, the ohmic contacts 23 and 24 are positioned coaxially with the p-n junction 22, the electrodes 11 and 12, and the leads 15 and 16.

In turn, the ohmic contacts 23 and 24 comprise respective anode and cathode contacts, with contact 23 representing the anode contact and contact 24 representing the cathode contact in the illustrated embodiment.

In the preferred embodiment of the invention, the anode contact 23 comprises an aluminum titanium alloy layer 25 adjacent the silicon carbide diode 13 with a layer of aluminum 26 upon the aluminum titanium alloy. As discussed later herein with respect to the electrodes, aluminum is a preferred contact material to the electrodes even where another material is selected as the ohmic contact. The cathode contact comprises a nickel layer 27 with an aluminum contact 30 adjacent thereto with a conductive diffusion barrier between the aluminum contact 30 and the nickel layer 27 for preventing the diffusion of aluminum and nickel between the respective contacts. As known to those familiar with these materials, at the high temperatures over which the diode 10 can operate, aluminum and nickel have an inherent tendency to form a brittle alloy which would crack under repeated temperature cycles and eventually cause the contacts and thus the entire packaged diode 10 to fail.

As illustrated in FIG. 2, the conductive diffusion barrier comprises a first layer of titanium 31 upon the nickel layer 27, a layer of titanium nitride 32 upon the first titanium layer 31, and a second layer of titanium 33 upon the titanium nitride layer 32 and thus adjacent the aluminum layer 30. The combination of the titanium nitride layer 32 sandwiched between the two titanium layers 31 and 33 provides an effective barrier against the diffusion of aluminum or nickel atoms into the respective layer of the other metal.

The electrodes 11 and 12 that are adjacent each of the ohmic contacts 23 and 24 are formed of an electrically conductive material that has a coefficient of thermal expansion similar to the coefficient of thermal expansion of the semiconductor material for providing structural support to the junction diode 13 and electrical contact therewith. In preferred embodiments, the electrodes are formed of cylindrical slugs of molybdenum (Mo) or tungsten (W) with a layer of silver (Ag) on the faces of the electrodes that are in contact with the ohmic contacts 23 and 24. The silver on the slug face and the aluminum on the outwardmost portions of the junction diode 13 form a eutectic at the temperatures at which the packaged diode is and preferably sealed in a glass package as discussed later herein. As a result, the contacts between the electrodes 11, 12 and the diode 13 form metallized contacts (i.e. "metallurgical bonding") that are much preferred in such devices. In this sense, the aluminum layers can be thought of as providing an internal braze between the electrodes and the ohmic contacts.

Additionally, in the most preferred embodiment, the molybdenum electrodes are coated with molybdenum oxide to provide an improved bonding surface and a resulting improved bond between the electrodes 11 and 12 and the package 14 when the package is formed of glass. Although tungsten is more difficult to oxidize, the use of oxidized tungsten electrodes is contemplated as part of the invention.

Thus, the use of the silver metal between the ohmic contacts and the contact surfaces of the electrodes helps provide and maintain physical and electrical contact with both the ohmic contacts 23 and 24 and the electrodes 11 and 12 at the temperature excursions over which the diode operates. When silver metal plating is not used on the electrode faces, however, a small amount of silicon (Si) can be alloyed with the aluminum to raise the braze point of the aluminum and As illustrated in FIG. 1, in the preferred embodiment the anode slug 11 has a tapered end portion 34 so that the contact area that is in physical and electrical contact with the diode is smaller than the corresponding contact area 23 of the diode 13. The purpose of the tapered contact area 34 is to avoid short circuiting problems during the brazing portion of the manufacture of the packaged diode. In this regard, it will be understood that the illustrations in FIG. 1 and FIG. 2 are greatly exaggerated in showing the respective proportions of the junction diode 13, the ohmic contacts 23 and 24, and the diffusion barrier, as well as in showing the electrodes 11 and 12 slightly separated from the diode 13 and the ohmic contacts 23 and 24. It will be understood that this is for purposes of illustration and that in actuality all of the surfaces are in electrical contact with one another.

When the slug 11 is in contact with the ohmic contact 23, the slight expansion and contraction that takes place during over the expected temperature cycles exerts physical pressure upon the aluminum layer 26. If the pressure is great enough, and particularly if the area of the electrode face is greater than the area of the ohmic contact, the aluminum layer 26 could literally be squeezed out in a malleable fashion and could be forced into contact with both the p and n portions of the diode 13, thereby short circuiting the entire device. By forming the tapered end portion 34 of the slug 11, the area of the slug 11 that is in contact with the diode can be kept smaller than the size of the ohmic contact 23 and thus decrease the likelihood that such a problem can occur.

As best illustrated in FIG. 1, leads 15 and 16 extend from each of the electrodes 11 and 12 and are in contact therewith opposite each of the electrodes contact with the diode 13. Each lead is formed of an electrically conductive material, preferably copper (Cu) and is joined to the electrode by a brazing metal, illustrated in exaggerated fashion at 35. The brazing metal preferably comprises an alloy and most preferably a combination of gold and nickel. The melting temperature of the brazing alloy 35 is preferably less than the melting point of the material from which the leads are formed so that the braze will melt while the lead remains intact.

As used herein, the terms "braze" or "brazing alloy" refer to a conducting metal alloy, that has a melting point above 400° C. and that is used to form an adhesive bond between two other dissimilar metals without fusing those metals together. A braze wets the respective surfaces of two conductors to be joined and then solidifies to a mechanically strong solid. In forming a brazed joint, the braze will be melted, but not the metals being joined. By comparison, the term "solder" is often used to refer to such a joining material that will melt at a generally lower temperature.

In a preferred embodiment, the amount of gold present in the brazing alloy is sufficient for the brazing alloy to remain malleable and maintain an integral joint when the electrodes and the leads are formed of materials that have coefficients of linear expansion that are up to three times as great as one another. Preferably, the brazing alloy 35 is predominantly gold with the remainder nickel, more preferably the brazing alloy is at least 75% gold by weight, and in the most preferred embodiment the brazing alloy is about 82% gold and about 18% nickel by weight. It will be understood by those familiar with such devices and such materials, that the integrity of the contact between the leads 15, 16 and electrodes 11, 12 is fundamental to the successful repetitive operating characteristics of the device. As set forth earlier, a typical gold-copper (Au-Cu) braze would fail ("fatigue") when repetitively exposed to high temperatures and wide temperature excursions, with resulting cracks into which oxygen could enter and react to further weaken the joint.

It will be understood, however, that other metals or alloys will or are expected to work as the brazing metal provided they meet the criteria set forth above. For example, gold alone is expected to form an appropriate braze, but its melting point is high enough to make manufacturing inconvenient. Therefore, a eutectic mixture such as the gold-nickel alloy set forth earlier is generally most preferred.

FIGS. 3, 4 and 5 illustrate various aspects of the leads in more detail. The leads are preferably formed of copper and plated with a material, preferably gold, that inhibits electrolysis and oxidation of the leads 15, 16 and the brazing alloy 35 during the operation of the packaged diode 10 at the high operating temperatures and wide temperature excursions over which the diode can operate. It is, of course, well understood that many chemical reactions, including harmful oxidation and electrolysis, take place at faster rates at higher temperatures, and the entire packaged diode, including the leads must be formed so as to minimize the opportunity for such reactions to occur.

As illustrated in FIG. 3, the gold plated leads most preferably comprise a copper portion 36, a strike layer of gold 37 on the copper lead, an adjacent strike layer 40 of nickel on the gold strike layer 37 and a gold plate layer 41 on the strike layer 40 of nickel. As understood by those familiar with metallurgy and plating, "strike" is a term used to refer to a very thin plating layer which is typically on the order of about 30 microns or less and that is usually followed by another plating layer. It will be understood, however, that the designations "strike" and "plate" are used for illustrative purposes, and not for purposes of limitation. Similarly, as is the case with FIGS. 1 and 2, the proportions shown in FIG. 3 are greatly exaggerated for illustrative and clarifying purposes and are not intended to proportionally represent or limit the actual thicknesses of the layers or their proportional size with respect to one another. In a typical embodiment of the invention, the strike layers will be about 1 to 3 microns thick and the gold plate layer will be about 1 to 2 microns thick.

FIGS. 4 and 5 illustrate that the copper leads 15 and 16 can further comprise alternative structures which have certain advantages. FIG. 4 shows a double slug diode 10 in which each copper lead 15 or 16 comprises a copper core 36a, a steel sleeve 42 and a copper casing 36b surrounding the steel sleeve 42. The steel sleeve 42 adds structural strength and improves the magnetic handling characteristics of the lead, both useful considerations in applying manufacturing techniques, but without substantially changing the thermal characteristics of the lead. For example, a lead such as that illustrated in FIG. 4 will have 88% of the thermal conductivity of pure copper, but with the addition of good magnetic characteristics.

FIG. 5 shows an alternative embodiment in which the steel is in the form of a core 43 surrounded by copper 36. Such a structure is somewhat simpler to produce, and has favorable magnetic handling characteristics, but is more of a compromise in terms of thermal characteristics than is the embodiment in FIG. 4. For example, when a lead such as that illustrated in FIG. 5 is manufactured to have a 60% thermal conductivity (compared to Cu) its magnetic characteristics will fall off sharply.

Finally, the diode 13 and at least portions of the electrodes 11 and 12 are surrounded by a package 14 for maintaining the electrodes in physical and electrical contact with the ohmic contacts 23 and 24. The package 14 is formed of a material that has a coefficient of expansion similar enough to the coefficient of expansion of the electrode material for the resulting packaged diode 10 to remain integral when subjected to repeated thermal excursions between temperatures of about $-65°$ C.

to 350° C. or greater. The preferred packaging material is a glass for which the softening point is well above the packaged diode's operating temperature and which will not degrade at the packaged diode's high operating temperatures. For example, some leaded glasses may begin to exhibit reduction of lead oxide into elemental lead at such temperatures. In present embodiments, the most preferred material is borosilicate glass.

The device is produced according to the following sequence of steps. First, one of the nailhead lead (e.g. 15 or 16), a braze preform, and one of the molybdenum slugs are assembled in a graphite boat. A "perform" is a small disk of the brazing alloy that is more easily handled at room temperature. The use of a graphite boat for the manufacture of such double slug, axially oriented devices is familiar to this art and will not otherwise be described in detail, as those of ordinary skill in this art are able to determine useful embodiments without undue experimentation.

When the graphite boat is heated with either radiant heat or direct current in a non-oxidizing atmosphere, typically nitrogen or argon, at temperatures of about 990° C., the braze will melt sufficiently to join the lead and the slug.

After assembly and brazing, the molybdenum slug is oxidized to increase the efficiency of its bonding with the glass package. As stated earlier, Glass and molybdenum oxide form a hermetic seal, and the oxide coating also helps in wetting the slug as the glass is being added. The oxidation is typically carried in a chain furnace in an atmosphere of about 99% nitrogen and 1% oxygen at about 800° C. Next silver is plated on the slug faces, preferably by sputter deposition. The process is repeated with the corresponding other electrode, braze preform and lead in an alternative boat.

In meantime, the diode itself has been assembled with the appropriate ohmic contacts, the metals and metals compounds having been sputter deposited onto the silicon carbide chip. The diode and its contacts are added to one of the bonded slug and lead assemblies in one of the boats, as is a glass sleeve that will eventually form the outer package.

The two boats are then mated and an appropriate shutter plate removed so that the respective parts can fall together. The assembled boat is placed in a furnace and heated at approximately 720° C. under vacuum for about ten minutes. This is a period long enough for the parts to come to temperature, and time enough for the glass and the molybdenum oxide on the slugs to react, but no longer than is otherwise necessary from a manufacturing and safety standpoint, for which the preferred times will typically be as short as possible.

A gas is then added to a pressure of approximately 75 psi during a cool down period which typically lasts between 20 minutes and one hour. The pressurized gas, nitrogen being appropriate, helps cool the chamber but also helps force the softened glass to form an even better package against the slugs and the diode. This is commonly referred to as an "implosion" technique for manufacture.

Following the cool down period, the diodes are pretested and the electrical rejects removed. After pretesting the gold plating, including the strike layers described earlier, is added to the leads and protects the copper from oxidation or electrolysis at the high operating temperatures.

The resulting packaged diodes have been found to continue to give the outstanding rectifying characteristics previously described in the earlier incorporated co-pending U.S. applications Ser. Nos. 07/284,035 and 07/403,690. Additionally, diodes according to the present invention have been tested through over 30,000 temperature cycles between 45° and 350° C. without failure and while continuing to exhibit such characteristics.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A packaged diode suitable for operation at temperatures about 200° C. and during temperature excursions between −65° C. and at least 350° C., the packaged diode comprising:

a diode formed of silicon carbide and having respective p and n portions with a p-n junction therebetween, and that is stable and that will exhibit satisfactory diode characteristics at temperatures greater than 200° C. and over temperature excursions between −65° C. and 350° C.;

ohmic contacts to opposite sides of said junction diode for making electrical contact to the respective p and n portions of said junction diode, and formed of materials that can physically withstand temperature excursions between −65° C. and 350° C. while maintaining physical and electrical contact with said diode and while avoiding unfavorable physical, chemical and metallurgical reactions with adjacent materials at such temperatures and during such temperature excursions;

an electrode adjacent each of said ohmic contacts and in electrical contact therewith and formed of an electrically conductive material that has a coefficient of thermal expansion similar to the coefficient of thermal expansion of silicon carbide for providing structural support to said junction diode and electrical contact with said junction diode;

a lead to each of said electrodes and in contact therewith opposite each said electrode's contact with said diode, each said lead being formed of an electrically conductive material and joined to said electrode by a brazing alloy that comprises an alloy of gold and nickel in which the amount of gold present by weight is greater than the amount of nickel present by weight by an amount sufficient for said alloy to remain malleable and maintain an integral joint between said electrodes and said leads when said electrodes and said leads have thermal coefficients of linear expansion that differ substantially from one another when said electrodes and leads are subjected to repeated thermal excursions between temperatures of about −65° C. to 350° C. or greater; and a glass package surrounding said diode and at least portions of said electrodes for maintaining said electrodes in physical and electrical contact with said ohmic contacts, said package being formed of a glass that has a coefficient of expansion similar enough to the coefficient of expansion of said electrode material for the resulting packaged diode to remain integral when subjected to repeated thermal excursions between temperatures of about −65° C. to 350° C. or greater.

2. A packaged diode according to claim 1 wherein said ohmic contacts are positioned coaxially with said p-n junction, said electrodes are positioned coaxially with said ohmic contacts, and said leads are positioned coaxially with said electrodes.

3. A packaged diode according to claim 1 wherein said electrodes are formed of molybdenum.

4. A packaged diode according to claim 1 wherein said electrodes are formed of molybdenum with a layer of silver on the faces of said electrodes that are in contact with said ohmic contacts.

5. A packaged diode according to claim 1 wherein said electrodes are formed of tungsten.

6. A packaged diode according to claim 1 wherein said p-n junction is an abrupt p-n junction.

7. A packaged diode according to claim 1 wherein said junction comprises a first portion of monocrystalline alpha silicon carbide having a first conductivity type and a flat interface surface that is inclined more than one degree off axis with respect to a basal plane thereof substantially towards one of the $<11\bar{2}0>$ directions, and a second portion of monocrystalline silicon carbide that comprises an epitaxial layer of alpha silicon carbide having the opposite conductivity type homoepitaxially deposited on said flat interface surface of said first portion to form said p-n junction.

8. A packaged diode according to claim 1 wherein the melting temperature of said brazing alloy is less than the melting point of said lead material.

9. A packaged diode according to claim 1 wherein the amount of gold present in said brazing alloy is sufficient for said brazing alloy to remain malleable and maintain an integral joint when said electrodes and said leads are formed of materials that have coefficients of linear expansion that are up to three times as great as one another.

10. A packaged diode according to claim 1 wherein said ohmic contacts comprise aluminum.

11. A packaged diode according to claim 1 wherein one of said electrodes forms an anode and said ohmic contact to said anode comprises an aluminum-titanium alloy.

12. A packaged diode according to claim 1 wherein one of said electrodes forms a cathode and said ohmic contact to said cathode comprises nickel.

13. A packaged diode according to claim 1 wherein said leads further comprises means for preventing oxidation and electrolysis of said leads when said leads are subjected to repeated temperature excursions between −65° C. and 350° C.

14. A packaged diode suitable for operation at temperature above 200° C. and during temperature excursions between −65° C. and at least 350° C., the packaged diode comprising:
   a silicon carbide diode having respective p and n portions with a p-n junction therebetween;
   ohmic contacts to opposite sides of said junction diode for making electrical contact to the respective p and n portions of said junction diode, and formed of materials that can physically withstand temperature excursions between −65° C. and 350° C. while maintaining physical and electrical contact with said diode and while avoiding unfavorable physical, chemical and metallurgical reactions with adjacent materials at such temperatures and during such temperature excursions;
   a molybdenum electrode positioned coaxially with said junction diode adjacent each of said ohmic contacts for providing structural support to said junction diode and electrical contact with said junction diode;
   a layer of silver metal between said ohmic contacts and the contact surfaces of each said electrode for providing and maintaining physical and electrical contact with both said ohmic contacts and said electrodes both a temperatures greater than 200° C. and over temperature excursions between about −65° C. and 350° C.;
   a coaxially positioned copper lead to each of said electrodes and in contact therewith opposite each said electrode's contact with said diode, each said lead being joined to said electrode by a brazing alloy comprising an alloy of gold and nickel in which the amount of gold present by weight is greater than the amount of nickel present by weight by an amount sufficient for the alloy to remain malleable and maintain an integral joint between said molybdenum electrodes and said copper leads when said electrodes and said leads are subjected to repeated thermal excursions between temperatures of about − 65° C. to about 350° C. or greater; and
   a glass package surrounding said junction diode and portions of said axially positioned electrodes.

15. A packaged diode according to claim 14 wherein said ohmic contacts comprise respective anode and cathode contacts and wherein said anode contact comprises an aluminum titanium alloy adjacent said silicon carbide diode and a layer of aluminum upon said alloy; and
   said cathode contact comprises a nickel layer on said diode with an aluminum contact adjacent thereto with a conductive diffusion barrier between said aluminum contact and said nickel layer for preventing the diffusion of aluminum and nickel between said respective contacts.

16. A packaged diode according to claim 15 wherein said conductive diffusion barrier comprises a first layer of titanium upon said nickel layer, a layer of titanium nitride upon said first titanium layer, and a second layer of titanium upon said titanium nitride layer.

17. A packaged diode according to claim 14 wherein said alloy joining said leads with said electrodes comprises a brazing alloy that is predominantly gold with the remainder nickel.

18. A packaged diode according to claim 17 wherein said brazing alloy is at least about 75% gold by weight.

19. A packaged diode according to claim 17 wherein said brazing alloy is about 82% gold and about 18% nickel by weight.

20. A packaged diode according to claim 14 wherein said coaxially positioned leads to each of said electrodes further comprises a copper lead with a gold layer plated thereon for reducing electrolysis and oxidation of said leads and said alloy during the operation of said diode at high operating temperatures and over wide temperature excursions.

21. A packaged diode according to claim 20 wherein said gold plated leads further comprises a strike layer of gold on said copper lead and an adjacent strike layer of nickel on said strike layer of gold.

22. A packaged diode according to claim 14 wherein said molybdenum electrodes are coated with molybdenum oxide to provide an improved bonding surface and a resulting improved bond between said electrodes and said glass package.

23. A brazing metal for joining electrode slugs formed of a first metal to coaxially positioned leads formed of a second metal in a packaged device formed from a silicon carbide p-n junction diode, said brazing metal comprising an alloy of gold and nickel in which the amount of gold present by weight is greater than the amount of nickel present by weight by an amount sufficient for the alloy to remain malleable and maintain an integral joint between said first and second metals when said metals have different thermal coefficients of linear expansion and for which the greater thermal coefficient of liner expansion is up to 3 times as great as the other and when those metals are subjected to repeated thermal excursions between temperatures of about −65° C. to about 350° C. or greater.

24. A double slug rectifying diode suitable for operation at temperatures greater than 200° C. and over temperature excursions of between about −65° C. and 350° C., said rectifying diode comprising:
a coaxially aligned pair of electrode slugs;
a p-n junction diode formed of silicon carbide disposed between said slugs and in electrical contact therewith;
a glass package encapsulating said slugs and said silicon carbide diode that has a coefficient of expansion similar enough to the coefficient of expansion of said electrode material for the resulting packaged diode to remain integral when subjected to repeated thermal excursions between temperatures of about −65° C. to 350° C. or greater;
a coaxially positioned lead adjacent each of said coaxially aligned electrode slugs;
a brazing alloy joining each said slugs to a respective lead, said brazing alloy comprising an alloy of gold and nickel in which the amount of gold present by weight is greater than the amount of nickel present by weight by an amount sufficient for the alloy to remain malleable and maintain an integral joint between said first and second metals when said metals have different thermal coefficients of linear expansion and for which the greater thermal coefficient of linear expansion is up to 3 times as great as the other when those metals are subjected to repeated thermal excursions between temperatures of about −65° C. to about 350° C. or greater.

25. A double slug rectifying diode suitable for operation at temperatures greater than 200° C. and over temperature excursions of between about −65° C. and 350° C., said rectifying diode comprising:
a coaxially aligned pair of electrode slugs formed of molybdenum;
a p-n junction diode formed of silicon carbide disposed between said slugs and in electrical contact therewith;
a glass package encapsulating said silicon carbide diode and the portions of aid molybdenum electrodes adjacent said diode formed of a glass that has a coefficient of expansion similar enough to the coefficient of expansion of said electrode material for the resulting packaged diode to remain integral when subjected to repeated thermal excursions between temperatures of about −65° C. to 350° C. or greater;
a coaxially positioned copper lead adjacent each of said coaxially aligned electrode slug;
a brazing alloy joining each said slug to a respective lead, said brazing alloy comprising an alloy of gold and nickel in which the amount of gold present by weight is greater than the amount of nickel present by weight by an amount sufficient for the alloy to remain malleable and maintain an integral joint between said first and second metals when said metals have different thermal coefficients of linear expansion and for which the greater thermal coefficient of linear expansion is up to 3 times as great as the other when those metals are subjected to repeated thermal excursions between temperatures of about −65° C. to about 350° C. or greater.

26. A double slug diode according to claim 25 wherein said copper lead further comprises a copper core, a steel sleeve around said copper core and a copper casing surrounding said steel sleeve.

27. A double slug diode according to claim 25 wherein said copper lead further comprises a steel core and a copper casing surrounding said steel core.

28. A double slug diode according to claim 25 wherein said electrode slug that represents the anode slug has a contact area in physical and electrical contact with said diode that is smaller than the corresponding contact area of the diode.

29. A packaged diode suitable for operation at temperatures above 200° C. and during temperature excursions between −65° C. and at least 350° C., the packaged diode comprising:
a diode formed of silicon carbide and having respective p and n portions with a p-n junction therebetween, and that is stable and that will exhibit satisfactory diode characteristics at temperatures greater than 200° C. and over temperature excursions between −65° C. and 350° C.;
ohmic contacts to opposite sides of said junction diode for making electrical contact to the respective p and n portions of said junction diode, and formed of materials that can physically withstand temperature excursions between −65° C. and 350° C. while maintaining physical and electrical contact with said diode and while avoiding unfavorable physical, chemical and metallurgical reactions with adjacent materials at such temperatures and during such temperature excursions;
an electrode adjacent each of said ohmic contacts and in electrical contact therewith and formed of an electrically conductive material that has a coefficient of thermal expansion similar to the coefficient of thermal expansion of silicon carbide for providing structural support to said junction diode and electrical contact with said junction diode;
an oxidized bonding surface on said electrodes;
a lead to each of said electrodes and in contact therewith opposite each said electrode's contact with said diode, each said lead being formed of an electrically conductive material and joined to said electrode by a brazing alloy that comprises an alloy of gold and nickel in which the amount of gold present by weight is greater than the amount of nickel present by weight by an amount sufficient for said alloy to remain malleable and maintain an integral joint between said electrodes and said leads when said electrodes and said leads have thermal coefficients of linear expansion that differ substantially from one another when said electrodes and leads are subjected to repeated thermal excursions between temperatures of about −65° C. to 350° C. or greater; and
a glass package surrounding said diode and at least portions of said oxidized bonding surfaces on said electrodes for maintaining said electrodes in physical and electrical contact with said ohmic contacts, said package being formed of a glass that has a coefficient of expansion similar enough to the coefficient of expansion of said electrode material for the resulting packaged diode to remain integral when subjected to repeated thermal excursions between temperatures of about −65° C. to 350° C. or greater.

* * * * *